United States Patent
Varadarajan et al.

(10) Patent No.: US 9,318,222 B2
(45) Date of Patent: Apr. 19, 2016

(54) HIERARCHICAL, DISTRIBUTED BUILT-IN SELF-REPAIR SOLUTION

(71) Applicant: Texas Instruments Incorporated, Dallas, TX (US)

(72) Inventors: Devanathan Varadarajan, Bangalore (IN); Raghavendra Prasad KS, Bangalore (IN); Harsharaj Ellur, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 177 days.

(21) Appl. No.: 14/108,489

(22) Filed: Dec. 17, 2013

(65) Prior Publication Data

US 2014/0189450 A1 Jul. 3, 2014

Related U.S. Application Data

(60) Provisional application No. 61/746,699, filed on Dec. 28, 2012.

(51) Int. Cl.
*G11C 29/00* (2006.01)
*G11C 29/44* (2006.01)
*G11C 29/04* (2006.01)

(52) U.S. Cl.
CPC .......... *G11C 29/4401* (2013.01); *G11C 29/785* (2013.01); *G11C 2029/0409* (2013.01); *G11C 2029/4402* (2013.01)

(58) Field of Classification Search
CPC ............. G11C 29/4401; G11C 29/785; G11C 2029/0409; G11C 2029/4402
See application file for complete search history.

(56) References Cited

U.S. PATENT DOCUMENTS

| | | | |
|---|---|---|---|
| 2005/0149782 A1* | 7/2005 | McPartland | G11C 29/44 714/718 |
| 2006/0181941 A1* | 8/2006 | Chang | G11C 29/24 365/200 |
| 2008/0104469 A1* | 5/2008 | Riley | G11C 29/44 714/733 |

* cited by examiner

*Primary Examiner* — Sam Rizk
(74) *Attorney, Agent, or Firm* — John R. Pessetto; Frank D. Cimino

(57) ABSTRACT

A built-in self-test (BIST) circuit to test one or more memory blocks on an integrated circuit. The one or more memory blocks further includes a first memory block and a second memory block A built-in soft-repair controller (BISoR) is provided to soft repair the one or more memory blocks. The BIST circuit in conjunction with the BISoR is configured to test and soft repair the first memory block before performing test and soft repair of the second memory block.

25 Claims, 4 Drawing Sheets

HIERARCHICAL, DISTRIBUTED BUILT-IN SELF-REPAIR SOLUTION

TECHNICAL FIELD

This application claims the benefit of US Provisional Application No. 61/746,699, filed Dec. 28, 2012.

Embodiments of the disclosure relate generally to integrated circuits and more particularly to testing of an integrated circuit's on chip memory.

BACKGROUND

Integrated circuits (ICs) generally include various modules combined to perform various functions. For example, a digital signal processor (DSP) includes processor and memory blocks embedded in the IC. The memory blocks containing plurality of addressable memory locations are tested for defects, ensuring the operability of the IC. To test these blocks, special test circuits, referred to as "Built-In Self Test" (BIST) circuits are incorporated into the IC. BIST circuits generate a test pattern to determine whether the memory block is defective or not. In some cases, if the number of defective memory locations is relatively low, the BIST circuit provides redundant rows and/or columns that are used to repair defective rows and columns in the memory block.

The embedded memory blocks are susceptible to manufacturing variations and hence more defects. All the memory blocks are tested serially by BIST circuits. A single BIST circuit performing testing and repairing of memory blocks takes longer time especially when density of memory blocks on the IC is high. One solution would be to get more BIST circuits on the chip, but this is not practical as it results in increased area and hence higher costs.

Thus, there is a need to efficiently test on chip memories without requiring an enormous amount of time and also without increasing overall area of IC.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an integrated circuit having one or more memory blocks. The one or more memory blocks further includes a first memory block and a second memory block. The IC also includes a built-in self-test (BIST) circuit to test the one or more memory blocks. A built-in soft-repair controller (BISoR) is provided to soft repair the one or more memory blocks. The BIST circuit in conjunction with the BISoR is configured to test and soft repair the first memory block before performing test and soft repair of the second memory block.

Another example embodiment provides an integrated circuit (IC). The IC comprises one or more memory arrays, each memory array comprising one or more memory blocks. The IC also includes a built-in self-test (BIST) circuit configured to test one or more memory blocks in parallel. One or more built-in soft-repair controllers (BISoR) are provided on the IC and each BISoR is dedicated to a memory array. Each BISoR is simultaneously activated to soft repair one or more memory blocks which are being tested by the BIST circuit in parallel.

Another embodiment provides a method of testing an integrated circuit (IC). The IC comprises a memory array that has one or more memory blocks. A built-in self-test (BIST) circuit configures a first memory block of the one or more memory blocks. The first memory block is tested by the BIST circuit. A built-in soft-repair controller (BISoR) collects information of failed memory locations during testing of the first memory block and convert this information into soft repair data which is stored in an internal memory of the BISoR. The BISoR copies the soft repair data from the internal memory to the first memory block and the internal memory is henceforth erased for soft repair of a second memory block of the one or more memory blocks. The erasing of the internal memory is completed by the BISoR before the BIST circuit completes configuration of the second memory block for testing.

An example embodiment provides a method for testing on chip memory on an integrated circuit (IC). The IC comprises a plurality of memory arrays and each memory array further comprises one or more memory blocks. A first memory block in each of the plurality of memory arrays is tested by a built-in self-test (BIST) circuit. The IC further includes a plurality of built-in soft-repair controller (BISoR) and each memory array has a dedicated BISoR. The plurality of BISoR collects information of failed memory locations during testing of the first memory block in each of the plurality of memory arrays. The information of failed memory locations is converted into a soft repair data by the BISoR dedicated to each memory array. The soft repair data is stored in an internal memory of the respective BISoR. The BISoR copies the soft repair data from the internal memory of BISoR to the first memory block of the respective memory array. The internal memory of each BISoR is erased for soft repair of a second memory block in each of the plurality of memory arrays. The erasing of the internal memory is completed by the respective BISoR before the BIST circuit completes configuration of the second memory block in each of the plurality of memory arrays for testing.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
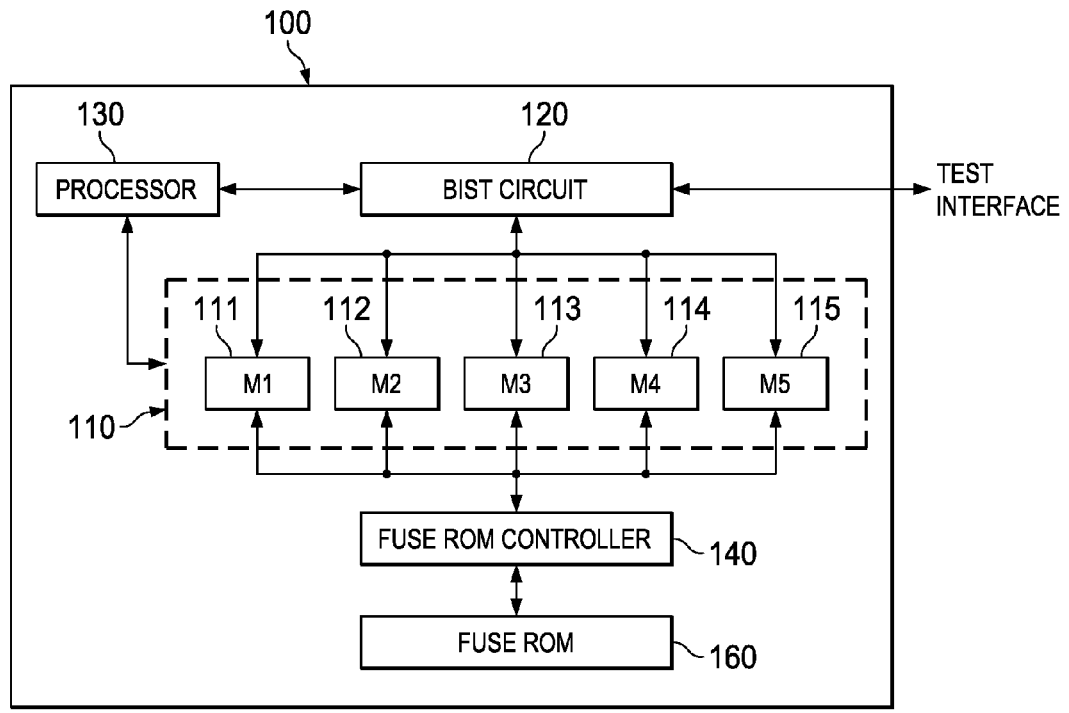
FIG. 1 illustrates a block diagram of a test system for an integrated circuit (IC)

Embodiments described herein provide systems and method for on chip testing in an integrated circuit (IC). FIG. 1 is a block diagram of a test system for an IC 100. The integrated circuit 100 includes a memory array 110 which further comprises one or more memory blocks (e.g. a memory block M1 (111), M2 (112), M3 (113), M4 (114), M5 (115) as illustrated in FIG. 1). It is to be noted that the memory blocks 111-115 illustrated in FIG. 1 is according to an example embodiment and that the memory array 110 in some embodiments comprises one or plurality of memory blocks. Each memory block comprises plurality of addressable memory locations. Each memory block has redundant memory locations/redundant memory cells that are available to replace faulty memory locations in memory blocks 111-115. Alternatively, in some embodiments, the IC 100 is provided with a redundant memory that is available to replace faulty memory cells in memory blocks 111-115. In some embodiments, the memory blocks 111-115 are provided with redundant rows and/or columns that are available to replace faulty memory cells in memory blocks 111-115. A built-in self-test (BIST) circuit 120 is coupled to the memory array 110. The BIST circuit 120 includes a test interface output from the integrated circuit 100. The integrated circuit 100 includes a processor 130 coupled to the memory array 110 and BIST circuit 120. The integrated circuit 100 includes a Fuse ROM controller 140 coupled to the memory array 110. The Fuse ROM controller 140 is further coupled to a Fuse ROM 160. In an example embodiment, the Fuse ROM controller 140 is coupled to the BIST circuit 120. It is noted that the elements of the integrated circuit 100 illustrated in FIG. 1 (e.g. the processor 130, the Fuse ROM controller 140, and the Fuse ROM 160) are optional and may be included or not included in embodiments of the integrated circuit 100 as desired. Additionally, embodiments including the memory array 110 with a single memory block 111 are contemplated.

The integrated circuit 100 is designed for any desired function, and includes circuitry and memory array 110 used to implement that function. In an embodiment, the processor 130 is a microprocessor. In one embodiment, the memory blocks 111-115 are caches implemented in the microprocessor or other arrays implemented in the microprocessor (e.g. translation lookaside buffers etc.). In an alternative embodiment, the integrated circuit 100 includes one or more processors 130 and supporting circuitry (e.g. the Fuse ROM controller 140) in an integrated processor configuration (e.g. a microcontroller or embedded processor). In such an implementation, the memory blocks 111-115 include caches or other memories for the processor 130, memories for the supporting circuitry, etc. In another embodiment, one or more processors and one or more peripheral circuits (e.g. I/O interface circuits or integrated I/O peripherals) are included in an SOC configuration. The memory blocks 111-115 would then include caches or other memories for the processor 130, memories for the peripheral circuits, etc. In an embodiment, the integrated circuit 100 includes no processors and is a fixed-function integrated circuit such as an application specific integrated circuit (ASIC). The memories in this case are arrays used by the fixed-function circuitry. Generally, as used herein, a memory is any storage implemented on an integrated circuit. For example, memory includes SRAM, DRAM, DDR memory, SDRAM, etc.

The operation of the circuit illustrated in FIG. 1 is explained now. The BIST circuit 120 receives an execution signal from the processor 130 to execute a BIST test pattern. In one example embodiment, the execution signal is received from a tester (not illustrated in FIG. 1) through the test interface. Alternatively, in one embodiment, the BIST circuit 120 comprises a logic unit to generate the execution signal. On receiving the execution signal, the BIST circuit 120 generates the BIST test pattern. The BIST test pattern is a series of writes and reads performed on the memory block 111. The write and read data are compared by the BIST circuit 120. If a mismatch is detected, an error log is created and stored in the memory block 111. After BIST operation, the Fuse ROM controller 140 copies the error log stored in the memory block 111 to Fuse ROM 160. The Fuse ROM controller 140 programs a memory repair data into the Fuse ROM 160 by blowing one or more fuses of the Fuse ROM 160. This is termed as hard repair. The Fuse ROM controller 140 is further configured to copy the hard repaired data to the memory block 111. The testing of next memory block 112 is performed by BIST circuit 120 followed by data repair by Fuse ROM controller 140. This process is repeated for all the memory blocks in the memory array 110. This process is time consuming since all the memory blocks in the array are tested and repaired serially.

Figure 2:
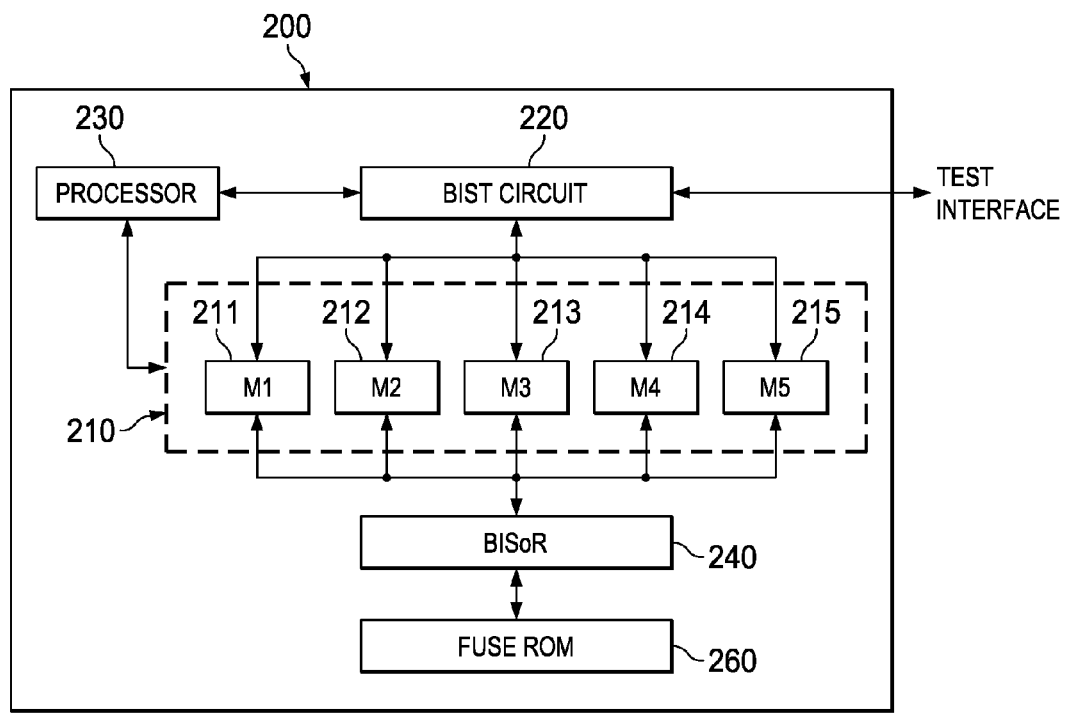
FIG. 2 illustrates a block diagram of one embodiment of a test system for an integrated circuit.

FIG. 2 is a block diagram of one embodiment of a test system for an integrated circuit (IC) 200. The integrated circuit 200 includes a memory array 210 which further comprises one or more memory blocks (e.g. a memory block M1 (211), M2 (212), M3 (213), M4 (214), M5 (215) illustrated in FIG. 2). It is to be noted that the memory blocks 211-215 illustrated in FIG. 2 is an example and that the memory array 210 in some embodiments includes one or a plurality of memory blocks. Each memory block comprises plurality of addressable memory locations. Each memory block has redundant memory locations/redundant memory cells that are available to replace faulty memory locations in memory blocks 211-215. Alternatively, in some embodiments, the IC 200 is provided with a redundant memory that is available to replace faulty memory cells in memory blocks 211-215. In an embodiment, the memory blocks 211-215 are provided with redundant rows and/or column that are available to replace faulty memory cells in memory blocks 211-215. A built-in self-test (BIST) circuit 220 is coupled to the memory array 210. The BIST circuit 220 has a test interface output from the integrated circuit 200. The integrated circuit 200 includes a processor 230 coupled to the memory array 210 and BIST circuit 220. The integrated circuit 200 includes a Built-in soft-repair controller (BISoR) 240 coupled to the memory blocks 211-215 of the memory array 210. In an example embodiment, the BISoR 240 is coupled to the BIST circuit 220. The BISoR 240 further comprises an internal memory (not illustrated in FIG. 2). The size of the internal memory is equal to the soft repair data size of the memory block with a maximum bit storage capacity of the one or more memory blocks 211-215. The BISoR 240 is coupled to a Fuse ROM 260. In an example embodiment, the BISoR 240 and the Fuse ROM 260 have a test interface output from the integrated circuit 200. Additionally, embodiments including the memory array 210 with a single memory block 211 are contemplated. In one of the embodiments, the memory blocks 211-215 are arranged in a daisy-chain fashion and the BISoR 240 is coupled to the first (211) and the last (215) memory block in the daisy chain.

The operation of the circuit illustrated in FIG. 2 is explained now. The BIST circuit 220 configures the memory block 211 for testing. The BIST circuit 220 receives an execution signal from processor 230 to execute a BIST test pattern. In one example embodiment, the execution signal is received from a tester (not illustrated in FIG. 1) through the test interface. Alternatively, in one of the embodiment, the BIST circuit 220 includes a logic unit to generate the execution signal. On receiving the execution signal, the BIST circuit 220 generates a BIST test pattern. The BIST test pattern is a series of writes and reads performed on memory block 211. The write and read data are compared by the BIST circuit 220. If a mismatch is detected, an error log is created by BISoR 240 and stored in the memory block 211. The error log is information of failed memory locations in the memory block 211. The BISoR 240 reads the error log stored in the memory block 211. The BISoR 240 converts the information of failed memory locations into a soft repair data. The soft repair data is stored in an internal memory of BISoR 240. The BISoR 240 is configured to copy the soft repair data from the internal memory to the memory block 211. The internal memory is henceforth erased by BISoR 240 for soft repair of a next memory block. The above process steps performed by BISoR 240 are termed as soft repair. It is noted that the above steps are examples and some of the steps are optional or the order of the steps might change depending on the application for which the IC 200 is fabricated. After completion of testing of memory block 211, the BIST circuit 220 configures the next memory block 212 for testing. The BISoR 240 soft repairs the memory block 211 before BIST 220 completes configuration of the memory block 212. The BISoR 240 initiates the process of soft repair of memory block 212 when the BIST 220 completes configuration of memory block 212 and initiates the process of testing the memory block 212. This process of testing and soft repairing each memory block is repeated for all the blocks inside the memory array 210. Additionally, embodiments including testing and soft repairing of selective memory blocks inside memory array 210 are contemplated.

On completion of the test and soft repair of all the memory blocks inside memory array 210, the BISoR 240 copies the soft repair data stored in each of the memory blocks to the Fuse ROM 260. The BISoR 240 maintains a mapping table that contains mapping of addresses of Fuse ROM 260 to each memory block. The BISoR 240 programs a memory repair data into the Fuse ROM 260 by blowing one or more fuses of the Fuse ROM 260. This is termed as hard repair. The BISoR 240 is further configured to copy the hard repaired data to the respective memory blocks using the mapping table. In one embodiment, the test and repair of the memory blocks is performed at multiple voltage levels to improve memory robustness. In one embodiment, through the implementation of the above discussed test system 200, the repair test time is significantly reduced by 56% as compared to the test system 100 of FIG. 1. In addition to this reduction in repair time, the area used to implement the test system 200 is five times less than used for test system 100 because soft repair of memory blocks reduces the repair area overhead that is otherwise required in test system 100. The test system 200 is hierarchical in nature since the BISoR 240 is shared across multiple memories, thereby reduces repair time and saves area.

Figure 3:
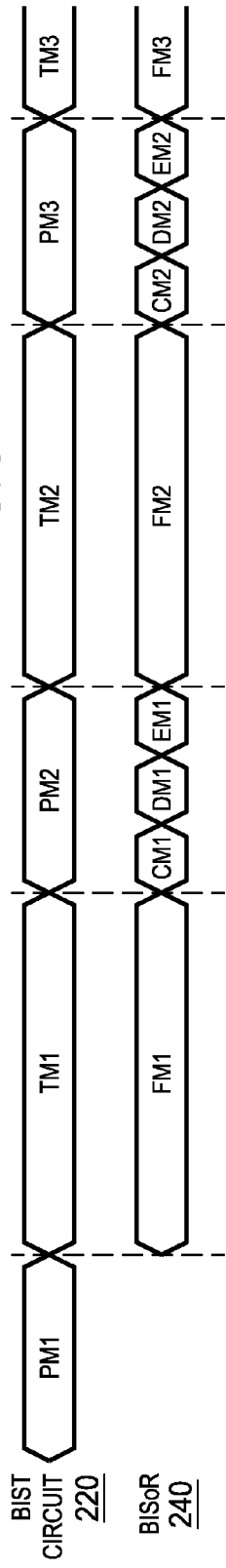
FIG. 3 is a timing diagram illustrating the functioning of BIST circuit and BISoR, according to an embodiment.

FIG. 3 is a timing diagram that further illustrates the functioning of the BIST circuit 220 and the BISoR 240. PM1 represents the programming cycles the BIST circuit 220 takes to configure the memory block 211. TM1 represents the programming cycles the BIST circuit 220 takes to test the memory block 211. PM2 represents the programming cycles the BIST circuit 220 takes to configure the memory block 212. TM2 represents the programming cycles the BIST circuit 220 takes to test the memory block 212. PM3 represents the programming cycles the BIST circuit 220 takes to configure the memory block 213. TM3 represents the programming cycles the BIST circuit 220 takes to test the memory block 213. FM1 represents the programming cycles the BISoR 240 takes to create an error log for the memory block 211. The error log is information of failed memory locations in memory block 211. CM1 represents the programming cycles the BISoR 240 takes to convert the information of failed memory locations into a soft repair data and storing the soft repair data in the internal memory of the BISoR 240. DM1 represents the programming cycles the BISoR 240 takes to copy the soft repair data from the internal memory to the memory block 211. EM1 represents the programming cycles the BISoR 240 takes to erase the internal memory. The process steps FM1, CM1, DM1 and EM1 represents soft repair of memory block 211. It is noted that the above steps are examples and some of the steps are optional or the order of the steps might change depending on the application for which the IC 200 is fabricated. FM2 represents the programming cycles the BISoR 240 takes to create an error log for the memory block 212. The error log is information of failed memory locations in memory block 212. CM2 represents the programming cycles the BISoR 240 takes to convert the information of failed memory locations into a soft repair data and storing the soft repair data in the internal memory of the BISoR 240. DM2 represents the programming cycles the BISoR 240 takes to copy the soft repair data from the internal memory to the memory block 212. EM2 represents the programming cycles the BISoR 240 takes to erase the internal memory. As illustrated in FIG. 2, the BISoR 240 creates error log (FM1) for memory block 211 during the cycles when the BIST circuit 220 is testing (TM1) the memory block 211. The BISoR 240 completes CM1, DM1 and EM1 while BIST circuit 220 configures (PM2) the memory block 212. It is noted that the timing diagram illustrated in FIG. 3 is for example and variations in the order of testing and soft repairing of memory blocks are contemplated. In an example embodiment, the testing and soft repairing of memory blocks is selective based on pre-defined criteria. For example, the BISoR 240 soft repairs $M^{th}$ memory block during the time when the BIST circuit 220 configures $N^{th}$ memory block, wherein M and N are memory blocks of memory array 210.

Figure 4:
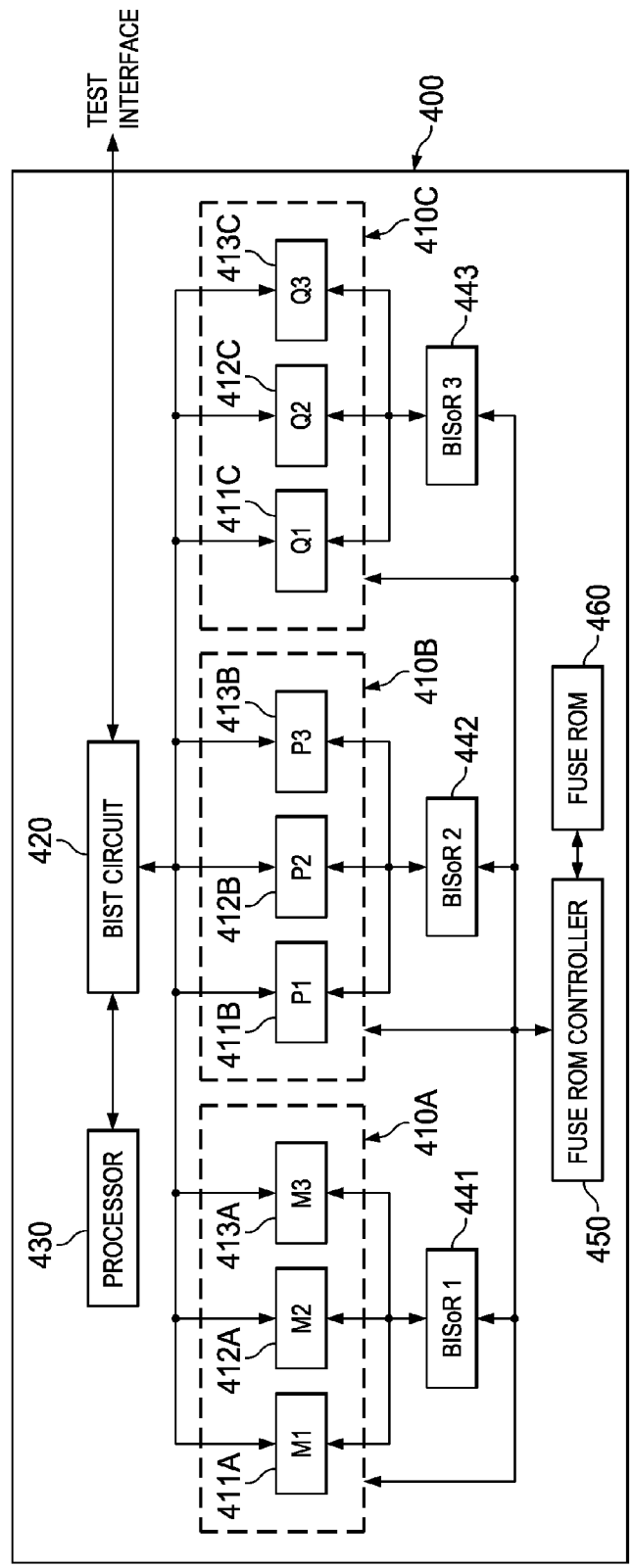
FIG. 4 illustrates a test system for the IC according to another embodiment.

FIG. 4 illustrates a test system for an integrated circuit (IC) 400 according to another embodiment. The integrated circuit 400 includes one or more memory arrays (e.g.: memory array 410A, memory array 410B, and memory array 410C illustrated in FIG. 4). Each memory array further comprises one or more memory blocks (e.g. memory array 410A comprises memory blocks M1 (411A), M2 (412A), M3 (413A), memory array 410B comprises memory blocks P1 (411B), P2 (412B), P3 (413B), memory array 410C comprises memory blocks Q1 (411C), Q2 (412C), Q3 (413C), illustrated in FIG. 4). It is noted that the memory blocks illustrated in FIG. 4 is for example and in some embodiments, the memory array 410A-410C comprises one or a plurality of memory blocks. Additionally, in alternative embodiments, each memory array 410A, 410B and 410C comprises a different number of memory blocks. Each memory block comprises a plurality of addressable memory locations. Each memory block has redundant memory locations/redundant memory cells that are available to replace faulty memory locations in memory blocks. Alternatively, in some embodiments, the IC 400 is provided with a redundant memory that is available to replace faulty memory cells in memory blocks. In an example embodiment, the memory blocks are provides with redundant rows and/or column that are available to replace faulty memory cells in memory blocks. A built-in self-test (BIST) circuit 420 is coupled to the memory arrays 410A-410C. The BIST circuit 420 has a test interface output from the integrated circuit 400. The integrated circuit 400 includes a processor 430 coupled to the memory arrays 410A, 410B, 410C and BIST circuit 420. The integrated circuit 400 includes one or more Built-in soft-repair controller (BISoR) (e.g. a Built-in soft-repair controller BISoR1 (441), BISoR2 (442), BISoR3 (443), illustrated in FIG. 4). It is noted that the BISoR illustrated in FIG. 4 is example and that the IC 400 in some embodiments includes one or a plurality of BISoR. Each BISoR is dedicated to a particular memory array (e.g. BISoR1 441 is dedicated to memory array 410A, BISoR2 442 is dedicated to memory array 410B, and BISoR3 is dedicated to memory array 410C illustrated in FIG. 4). In some embodiments, the BISoR is dedicated to one or more memory arrays. In an example embodiment, the Built-in soft-repair controllers are coupled to the BIST circuit 420. The BISoR 441-443 further comprises an internal memory (not illustrated in FIG. 4). The size of the internal memory is equal to the soft repair data size of the memory block with a maximum bit storage capacity of the one or more memory blocks of the respective memory array. For example, the size of the internal memory of BISoR 441 would be equal to the soft repair data size of the memory block with the maximum bit storage capacity of M1 411A, M2 412A or M3 413A. The BISoR 441-443 and memory arrays 410A-410C are coupled to a Fuse ROM controller 450. The Fuse ROM controller 450 is further coupled to a Fuse ROM 460. In an example embodiment, the Fuse ROM controller 450 is coupled to the BIST circuit 420. In an example embodiment, the Fuse ROM controller 450 and the Fuse ROM 460 have a test interface output from the integrated circuit 200. Additionally, embodiments including the memory arrays with a single memory block are contemplated.

The operation of the circuit illustrated in FIG. 4 is explained now. The BIST circuit 420 simultaneously configures the memory blocks M1 411A, P1 411B and Q1 411C for testing. The BIST circuit 420 receives an execution signal from processor 430 to execute a BIST test pattern. In one example embodiment, the execution signal is received from a tester (not illustrated in FIG. 1) through the test interface. Alternatively, in one of the embodiment, the BIST circuit 420 includes a logic unit to generate the execution signal. On receiving the execution signal, the BIST circuit 420 generates a BIST test pattern. The BIST test pattern is a series of writes and reads simultaneously performed on memory blocks M1 411A, P1 411B and Q1 411C. The write and read data are compared by the BIST circuit 420. If a mismatch is detected, an error log is created by BISoR1 441, BISoR2 442, BISoR3 443 for the memory blocks M1 411A, P1 411B and Q1 411C respectively. The error log is stored in the respective memory blocks M1 411A, P1 411B and Q1 411C. The error log is information of failed memory locations in the memory blocks. The BISoR1 441, BISoR2 442, BISoR3 443 simultaneously reads the error log stored in the respective memory block M1 411A, P1 411B and Q1 411C. The BISoR1 441, BISoR2 442, BISoR3 443 converts the information of failed memory locations into a soft repair data. The soft repair data is stored respectively in an internal memory of BISoR1 441, BISoR2 442, and BISoR3 443 respectively. The BISoR1 441, BISoR2 442, BISoR3 443 are configured to copy the soft repair data from the internal memory to the respective memory block M1 411A, P1 411B and Q1 411C. The internal memory is henceforth erased by BISoR1 441, BISoR2 442, and BISoR3 443 for soft repair of the next memory block in the dedicated memory arrays. The above process steps performed by BISoR1 441, BISoR2 442, and BISoR3 443 are termed as soft repair. It is noted that the above steps are an example and some of the steps are optional or the order of the steps might change depending on the application for which the IC 200 is fabricated. In an alternative embodiment, the steps performed by BISoR are independent of other BISoR's present on the IC 400.

After completion of testing of memory blocks 411A, the BIST circuit 420 configures the next memory block 412A for testing. The BISoR1 441 soft repairs the memory block 411A before completion of the configuration of memory block 412A by BIST circuit 420. The BISoR1 441 initiates the process of soft repair of memory block 412A when the BIST circuit 420 completes configuration of memory block 412A and initiates the process of testing the memory block 412A. This process of testing and soft repairing each memory block is repeated for all the blocks inside the memory array 410A. The same process is followed for memory blocks in memory array 410B and 410C. Additionally, embodiments including testing and soft repairing of selective memory blocks inside memory array 410A, 410B and 410C are contemplated.

On completion of the test and soft repair of all the memory blocks inside memory array 410A, 410B and 410C, the Fuse ROM controller 450 copies the soft repair data stored in each of the memory blocks to the Fuse ROM 460. The Fuse ROM controller 450 maintains a mapping table that contains mapping of addresses of Fuse ROM 460 to each memory block. The Fuse ROM controller 450 programs a memory repair data into the Fuse ROM 460 by blowing one or more fuses of the Fuse ROM 460. This is termed as hard repair. The Fuse ROM controller 450 is further configured to copy the hard repaired data to the respective memory blocks using the mapping table. In one embodiment, the test and repair of the memory blocks is performed at multiple voltage levels to improve memory robustness. In an example embodiment, the function of Fuse ROM controller 450 is performed by one or more of Built-in soft-repair controllers e.g. BISoR1 (441), BISoR2 (442) or BISoR3 (443). In an embodiment, the Fuse ROM controller copies the soft repair data stored in the memory blocks of one or more memory arrays (memory arrays for which soft repair of all the memory blocks has been completed) to the Fuse ROM 460 even if the testing and soft repair of memory blocks in other memory arrays is in progress. In one embodiment, through the implementation of the above discussed test system 400, the total repair time is significantly reduced as compared to the test system of FIG. 1. The test system 400 is hierarchical in nature since the BISoR 441-443 are shared across multiple memories, thereby reducing the repair time. The test system 400 is distributed in nature since soft-repair of multiple memories is performed in parallel. In test system 400, at a time, no repair data is archived for multiple memories thereby reducing the required on-chip area.

Figure 5:
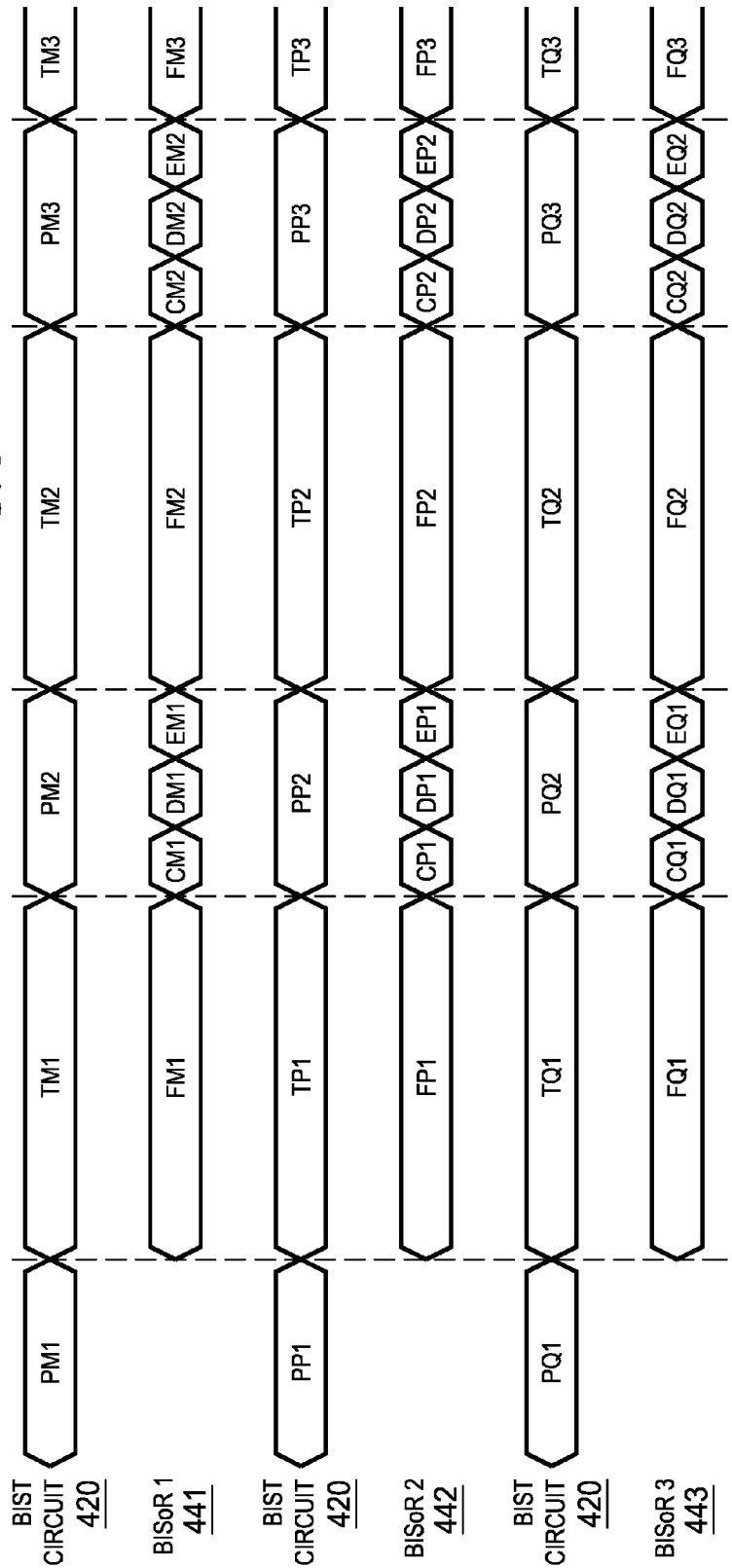
FIG. 5 is a timing diagram illustrating the functioning of BIST circuit and one or more BISoR, according to an embodiment.

FIG. 5 is a timing diagram that further illustrates the functioning of the BIST circuit 420 and the BISoR1 441, BISoR2 442, BISoR3 443. The following notations have been used in FIG. 5:

PM1 represents the programming cycles the BIST circuit 420 takes to configure the memory block 411A.

TM1 represents the programming cycles the BIST circuit 420 takes to test the memory block 411A.

PM2 represents the programming cycles the BIST circuit 420 takes to configure the memory block 412A.

TM2 represents the programming cycles the BIST circuit 420 takes to test the memory block 412A.

PM3 represents the programming cycles the BIST circuit 420 takes to configure the memory block 413A.

TM3 represents the programming cycles the BIST circuit 420 takes to test the memory block 413A.

FM1 represents the programming cycles the BISoR1 441 takes to create an error log for the memory block 411A. The error log is information of failed memory locations in memory block 411A.

CM1 represents the programming cycles the BISoR1 441 takes to convert the information of failed memory locations into a soft repair data and storing the soft repair data in the internal memory of the BISoR1 441.

DM1 represents the programming cycles the BISoR1 441 takes to copy the soft repair data from the internal memory to the memory block 411A.

EM1 represents the programming cycles the BISoR1 441 takes to erase the internal memory.

FM2 represents the programming cycles the BISoR1 441 takes to create an error log for the memory block 412A. The error log is information of failed memory locations in memory block 412A.

CM2 represents the programming cycles the BISoR1 441 takes to convert the information of failed memory locations into a soft repair data and storing the soft repair data in the internal memory of the BISoR1 441.

DM2 represents the programming cycles the BISoR1 441 takes to copy the soft repair data from the internal memory to the memory block 412A.

EM2 represents the programming cycles the BISoR1 441 takes to erase the internal memory.

PP1 represents the programming cycles the BIST circuit 420 takes to configure the memory block 411B.

TP1 represents the programming cycles the BIST circuit 420 takes to test the memory block 411B.

PP2 represents the programming cycles the BIST circuit 420 takes to configure the memory block 412B.

TP2 represents the programming cycles the BIST circuit 420 takes to test the memory block 412B.

PP3 represents the programming cycles the BIST circuit 420 takes to configure the memory block 413B.

TP3 represents the programming cycles the BIST circuit 420 takes to test the memory block 413B.

FP1 represents the programming cycles the BISoR2 442 takes to create an error log for the memory block 411B. The error log is information of failed memory locations in memory block 411B.

CP1 represents the programming cycles the BISoR2 442 takes to convert the information of failed memory locations into a soft repair data and storing the soft repair data in the internal memory of the BISoR2 442.

DP1 represents the programming cycles the BISoR2 442 takes to copy the soft repair data from the internal memory to the memory block 411B.

EP1 represents the programming cycles the BISoR2 442 takes to erase the internal memory.

FP2 represents the programming cycles the BISoR2 442 takes to create an error log for the memory block 412B. The error log is information of failed memory locations in memory block 412B.

CP2 represents the programming cycles the BISoR2 442 takes to convert the information of failed memory locations into a soft repair data and storing the soft repair data in the internal memory of the BISoR2 442.

DP2 represents the programming cycles the BISoR2 442 takes to copy the soft repair data from the internal memory to the memory block 412B.

EP2 represents the programming cycles the BISoR2 442 takes to erase the internal memory.

PQ1 represents the programming cycles the BIST circuit 420 takes to configure the memory block 411C.

TQ1 represents the programming cycles the BIST circuit 420 takes to test the memory block 411C.

PQ2 represents the programming cycles the BIST circuit 420 takes to configure the memory block 412C.

TQ2 represents the programming cycles the BIST circuit 420 takes to test the memory block 412C.

PQ3 represents the programming cycles the BIST circuit 420 takes to configure the memory block 413C.

TQ3 represents the programming cycles the BIST circuit 420 takes to test the memory block 413C.

FQ1 represents the programming cycles the BISoR3 443 takes to create an error log for the memory block 411C. The error log is information of failed memory locations in memory block 411C.

CQ1 represents the programming cycles the BISoR3 443 takes to convert the information of failed memory locations into a soft repair data and storing the soft repair data in the internal memory of the BISoR3 443.

DQ1 represents the programming cycles the BISoR3 443 takes to copy the soft repair data from the internal memory to the memory block 411C.

EQ1 represents the programming cycles the BISoR3 443 takes to erase the internal memory.

FQ2 represents the programming cycles the BISoR3 443 takes to create an error log for the memory block 412C. The error log is information of failed memory locations in memory block 412C.

CQ2 represents the programming cycles the BISoR3 443 takes to convert the information of failed memory locations into a soft repair data and storing the soft repair data in the internal memory of the BISoR3 443.

DQ2 represents the programming cycles the BISoR3 443 takes to copy the soft repair data from the internal memory to the memory block 412C.

EQ2 represents the programming cycles the BISoR3 443 takes to erase the internal memory.

As illustrated in FIG. 5, the BIST circuit 420 simultaneously configures and tests memory blocks 411A, 411B and 411C. The built-in soft-repair controllers create error log (FM1, FP1 and FQ1) for the memory blocks 411A-C during the cycles when the BIST circuit 420 is testing (TM1, TP1 and TQ1) the memory blocks 411A, 411B and 411C. The BISoR1 441 completes CM1, DM1 and EM1 while BIST circuit 420 configures (PM2) the memory block 412A. Similarly, BISoR2 442 completes CP1, DP1 and EP1 while BIST circuit 420 configures (PP2) the memory block 412B and BISoR3 443 completes CQ1, DQ1 and EQ1 while BIST circuit 420 configures (PQ2) the memory block 412C. It is noted that the timing diagram illustrated in FIG. 3 is example and variations in the order of testing and soft repairing of memory blocks are contemplated. In an example embodiment, the testing and soft repairing of memory blocks is selective based on predefined criteria. For example, the built-in soft-repair controller soft repairs Mth memory block during the time when the BIST circuit 420 configures $N^{th}$ memory block, wherein M and N are memory blocks inside the memory array.

Figure 6:
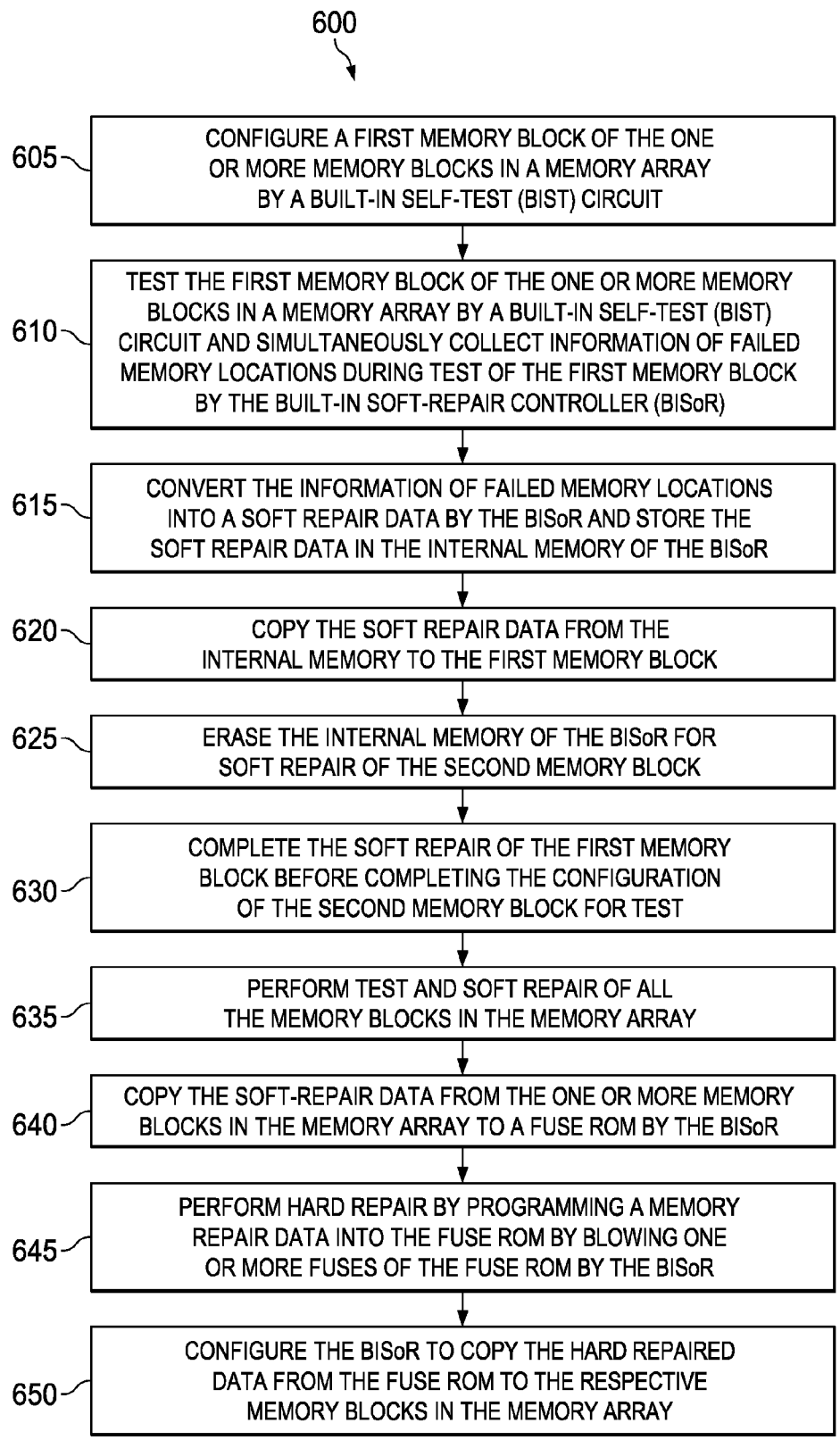
FIG. 6 is a flow diagram illustrating a test system for testing on an integrated circuit, according to an embodiment.

FIG. 6 is a flow diagram 600 illustrating a test system 200 for testing a memory array, comprising one or more memory blocks on an integrated circuit (IC) according to an embodiment. At step 605, a Built-in self-test (BIST) circuit 220 configures a first memory block for example memory block 211, of the one or more memory blocks in a memory array for testing. At step 610, the BIST circuit 220 tests the first memory block and simultaneously the Built-in soft-repair controller (BISoR) 240 collect information of failed memory locations during testing of the first memory block. The BISoR converts the information of failed memory locations into a soft repair data which is then stored in the internal memory of the BISoR, at step 615. The BISoR 240 copies the soft repair data from the internal memory to the first memory block, at step 620. At step 625, the internal memory of the BISoR is erased for soft repair of the second memory block of the one or more memory blocks in a memory array. The soft repair of the first memory block is completed before completion of the configuration of the second memory block for test by BIST circuit, at step 630. The BIST circuit in conjunction with the BISoR performs test and soft repair of all the memory blocks in the memory array, at step 635. The BISoR is configured to copy the soft repair data from the one or more memory blocks in the memory array to a Fuse ROM for example Fuse ROM 260, at step 640. At step 645, the BISoR performs hard repair by programming a memory repair data into the Fuse ROM by blowing one or more fuses of the Fuse ROM. At step 650, the BISoR is further configured to copy the hard repaired data from the Fuse ROM to the respective memory blocks in the memory array In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An integrated circuit comprising:
one or more memory blocks;
a built-in self-test (BIST) circuit configured to test one or more memory blocks, the one or more memory blocks having a first memory block and a second memory block;
a built-in soft-repair controller (BISoR) configured to soft repair the one or more memory blocks; and
the built-in self-test circuit in conjunction with the built-in soft-repair controller configured to test and soft repair the first memory block before performing test and soft repair of the second memory block.

2. The integrated circuit of claim 1, wherein each memory block of the one or more memory blocks comprises redundant rows, redundant columns or either of redundant rows and redundant columns.

3. The integrated circuit of claim 1, wherein soft repair of first memory block comprises the BISoR configured to:
collect information of failed memory locations during the test of the first memory block by the BIST circuit;
convert the information of failed memory locations into a soft repair data, wherein the soft repair data is stored in an internal memory of BISoR;
copy the soft repair data to the first memory block; and
erase the internal memory for soft repair of the second memory block.

4. The integrated circuit of claim 3, wherein the size of the internal memory of the BISoR is equal to the soft repair data size of the memory block with a maximum bit storage capacity of the one or more memory blocks.

5. The integrated circuit of claim 3, wherein the BISoR is configured to copy the soft repair data from the one or more memory blocks to a Fuse ROM, wherein the Fuse ROM is configured to perform hard repair of the one or more memory blocks.

6. The integrated circuit of claim 5, wherein the hard repair of the one or more memory blocks further comprises the BISoR configured to program a memory repair data into the Fuse ROM by blowing one or more fuses of the Fuse ROM.

7. The integrated circuit of claim 1, wherein the BISoR is configured to initiate the soft repair of the first memory block when the BIST circuit completes configuration of the first memory block, wherein each memory block is first configured by the BIST circuit before the test is performed on the memory block.

8. The integrated circuit of claim 1, wherein the BISoR completes soft repair of the first memory block when the configuration of the second memory block is completed by the BIST circuit.

9. An integrated circuit comprising:
one or more memory arrays, each memory array comprising one or more memory blocks;
a built-in self-test (BIST) circuit configured to test one or more memory blocks in parallel; and
one or more built-in soft-repair controllers (BISoR) configured to soft repair the memory blocks, wherein each built-in soft-repair controller is dedicated to a memory array, and wherein, each BISoR is simultaneously activated to soft repair one or more memory blocks which are being tested by the BIST circuit in parallel.

10. The integrated circuit of claim 9, wherein each memory block of the one or more memory blocks comprises redundant rows, redundant columns or either of redundant rows and redundant columns.

11. The integrated circuit of claim 9, wherein soft repair of the memory block comprises the BISoR configured to:
collect information of failed memory locations during the test of the memory block by the BIST circuit;
convert the information of failed memory locations into a soft repair data, wherein the soft repair data is stored in an internal memory of BISoR;
copy the soft repair data to the memory block; and
erase the internal memory for soft repair of a next memory block in the memory array.

12. The integrated circuit of claim 11, wherein the size of the internal memory of each BISoR is equal to the soft repair data size of the memory block with a maximum bit storage capacity of the one or more memory blocks in the memory array.

13. The integrated circuit of claim 11 further comprising a fuse ROM controller configured to copy the soft repair data from the one or more memory blocks to a Fuse ROM, wherein the Fuse ROM is configured to perform hard repair of the one or more memory blocks.

14. The integrated circuit of claim 13, wherein the hard repair of the one or more memory blocks further comprises the fuse ROM controller programming a memory repair data into the Fuse ROM by blowing one or more fuses of the Fuse ROM.

15. The integrated circuit of claim 9, wherein each BISoR initiates the soft repair of the one or more memory blocks after the BIST circuit completes configuration of the one or more memory blocks, wherein each memory block is first configured by the BIST circuit before the test is performed on the memory block.

16. A method of testing on chip memory on an integrated circuit, comprising:
configuring a first memory block of the one or more memory blocks in a memory array by a built-in self-test (BIST) circuit;
testing a first memory block of the one or more memory blocks in a memory array by the built-in self-test (BIST) circuit;
collecting information of failed memory locations during testing of the first memory block by a built-in soft-repair controller (BISoR);
converting the information of failed memory locations into a soft repair data by the BISoR and storing the soft repair data in an internal memory of the BISoR;

copying the soft repair data from the internal memory to the first memory block; and erasing the internal memory of the BISoR for soft repair of a second memory block of the one or more memory blocks, and wherein, the erasing of the internal memory is completed by the BISoR before the BIST circuit completes configuration of the second memory block for testing.

17. The method of testing an integrated circuit of claim 16 wherein each memory block of the one or more memory blocks comprises redundant rows, redundant columns or either of redundant rows and redundant columns.

18. The method of testing an integrated circuit of claim 16 wherein the size of the internal memory of the built-in soft-repair controller is equal to the soft repair data size of the memory block with a maximum bit storage capacity of the one or more memory blocks in a memory array.

19. The method of testing an integrated circuit of claim 16 further comprising copying the soft repair data from the memory blocks to a fuse ROM by the built-in soft-repair controller, wherein the fuse ROM is configured to perform hard repair of the memory blocks.

20. The method of testing an integrated circuit of claim 19, wherein performing hard repair of the memory blocks further comprises programming a memory repair data into the fuse ROM by blowing one or more fuses of the fuse ROM by the BISoR.

21. A method of testing on chip memory on an integrated circuit, comprising:
configuring a first memory block in each of a plurality of memory arrays by a built-in self-test (BIST) circuit, wherein each memory array comprises one or more memory blocks;
testing a first memory block in each of the plurality of memory arrays by a built-in self-test (BIST) circuit;
collecting information of failed memory locations during testing of the first memory block in each of the plurality of memory arrays by a plurality of built-in soft-repair controllers (BISoR), wherein each BISoR of a plurality of BISoR is dedicated to a memory array;
converting the information of failed memory locations into a soft repair data by the BISoR dedicated to each memory array and storing the soft repair data in an internal memory of the respective BISoR;
copying the soft repair data from the internal memory of BISoR to the first memory block of the respective memory array;
erasing the internal memory of the BISoR for soft repair of a second memory block in each of the plurality of memory arrays, and wherein, the erasing of the internal memory is completed by the respective BISoR before the BIST circuit completes configuration of the second memory block in each of the plurality of memory arrays for testing.

22. The method of testing an integrated circuit of claim 21, wherein each memory block of the one or more memory blocks comprises redundant rows, redundant columns or either of redundant rows and redundant columns.

23. The method of testing an integrated circuit of claim 21, wherein the size of the internal memory of the built-in soft-repair controller is equal to the soft repair data size of the memory block with a maximum bit storage capacity of the one or more memory blocks in a memory array.

24. The method of testing an integrated circuit of claim 21 further comprising copying the soft repair data from the one or more memory blocks to a fuse ROM by a fuse ROM controller, wherein the fuse ROM is configured to perform hard repair of the memory blocks.

25. The method of testing an integrated circuit of claim 24, wherein performing hard repair of the memory blocks further comprises programming a memory repair data into the fuse ROM by blowing one or more fuses of the fuse ROM by the fuse ROM controller.

* * * * *